United States Patent
Schunk

(10) Patent No.: US 9,107,333 B1
(45) Date of Patent: Aug. 11, 2015

(54) MOLDED LEADFRAME FOR PCB-TO-PCB CONNECTION

(71) Applicant: Avago Technologies General IP (Singapore) Pte. Ltd., Singapore (SG)

(72) Inventor: Nikolaus W. Schunk, Maxhuette-Haidhof (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 17 days.

(21) Appl. No.: 14/188,855

(22) Filed: Feb. 25, 2014

(51) Int. Cl.
*H01L 21/00* (2006.01)
*H05K 3/36* (2006.01)
*H01R 43/16* (2006.01)
*H01R 43/24* (2006.01)

(52) U.S. Cl.
CPC ............... *H05K 3/366* (2013.01); *H01R 43/16* (2013.01); *H01R 43/24* (2013.01)

(58) Field of Classification Search
CPC ............. H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/18; H01L 25/105; H01L 25/0657
USPC ......... 438/123, 617, 612, 109, 614, 108, 106, 438/51; 257/784, 666, 777, 787, 788
See application file for complete search history.

(56) References Cited

U.S. PATENT DOCUMENTS

2009/0239395 A1   9/2009   Cohen et al.
2014/0011313 A1   1/2014   Huckabee et al.
2014/0217566 A1*  8/2014   Goida et al. .................. 257/676

OTHER PUBLICATIONS

Tyco Electronics AMP Summary Catalogue [online]. Tyco Electronics, 2007 [retrieved on Jan. 28, 2014]. Retrieved from the Internet: <URL: http://www.tycoelectronics.cz/catalogue/pdf/catalogues/889813.pdf>.
Assembly Instructions for SCA6x0 and SCA10x0 series. Technical Note [online]. VTI Technologies Oy, Apr. 22, 2008 [retrieved on Jan. 28, 2014]. Retrieved from the Internet: <URL: http://www.muratamems.fi/sites/default/files/documents/tn71_assembly_instructions_for_sca6x0_and_sca10x0_0.pdf>.
Recommendations for Printed Circuit Board Assembly of Infineon P(G)-VQFN Packages. Product information [online]. Infineon Technologies AG, Mar. 2008 [retrieved on Feb. 3, 2014]. Retrieved from the Internet: <URL: http://www.infineon.com/dgdl/Recommendations+for+Board+Assembly_VQFN.pdf?folderId=db3a304412b91b910112b9a6854e000e&fileId=db3a30431936bc4b011980529f540b36>.
Leadframes. Catalogue No. 1654210 [online]. Tyco Electronics, Mar. 2003 [retrieved on Feb. 25, 2014]. Retrieved from the Internet: <URL: http://www.semitek.cz/tyco/amp_konektory/general/1654210_leadframes.pdf>.

* cited by examiner

*Primary Examiner* — Hoa B Trinh

(57) ABSTRACT

A method for making a leadframe includes removing a group of parallel, strip-shaped electrical conductors from a metal sheet, embedding end portions of the conductors in molding compound defining a leadframe body, and separating the conductors from each other, such that portions of the conductors remain encapsulated in the molding compound while other portions remain exterior to the molding compound and define leads of the resulting leadframe.

20 Claims, 12 Drawing Sheets

MOLDED LEADFRAME FOR PCB-TO-PCB CONNECTION

BACKGROUND

Electronic devices and modules are commonly mounted on printed circuit boards (PCBs). An electronic module, such as an optical transmitter or receiver module, may include a PCB. Mounting such a PCB-based opto-electronic module on a main PCB can be problematic due to narrow spacing between adjacent electrical signal leads.

An opto-electronic module includes an opto-electronic device, such as a semiconductor laser or photodiode, and commonly also includes a driver or receiver integrated circuit chip as well as one or more optical devices such as lenses. The laser converts electrical signals into optical signals. The photodiode converts optical signals into electrical signals. In some types of opto-electronic modules, the opto-electronic device and integrated circuit chip are mounted on a leadframe. In other types of opto-electronic modules, the opto-electronic device and integrated circuit chip are mounted on a module PCB. Wirebonds commonly connect the electronic and opto-electronic devices to the leadframe conductors or PCB circuit traces. The leadframe or module PCB, opto-electronic device, integrated circuit, and wirebonds are commonly encapsulated together in an optically transparent resin that forms a module case. Leadframe conductors or PCB circuit traces are coupled to electrical signal leads that extend from the case along one edge of the leadframe or PCB. Due to the compact size of such opto-electronic modules, the electrical signal leads may be bent and staggered to facilitate connecting them to pads on a main PCB. The electrical signal leads are commonly surface-mounted to the pads on the main PCB.

It is known to mount a secondary PCB (sometimes referred to as a daughterboard) in an orientation perpendicular to a primary or main PCB using a PCB-to-PCB connector comprising a molded plastic retaining block in which electrical leads are encapsulated. One end of each lead is mounted in a through-hole in the main PCB, and the other end of each lead is mounted in a through-hole in the daughterboard PCB. Each lead has a 90-degree bend. The bent portions of the leads are encapsulated in the retaining block. The retaining block can be fixed to the surface of the main PCB with screws or adhesive to provide mechanical integrity to the connection.

Surface-mount leadframes into which the edge of a secondary PCB can be plugged are known. Such a surface-mount leadframe comprises an elongated or bar-shaped conductor in which a socket-like structure has been formed between two opposing surface-mountable ends of the bar-shaped conductor. When the edge of a secondary PCB is plugged into the socket-like structure, an electrical connection is made between a trace or pad on the secondary PCB and the surface-mountable ends. An array of such surface-mounted leadframes can be provided in parallel to accordingly provide electrical contact between multiple secondary PCB circuit traces and corresponding main PCB traces or pads. An array of such surface-mount leadframes can be manufactured by stamping a single sheet of metal and then removing non-functional cross-portions of the metal that serve only to retain the leadframes together during manufacturing.

It would be desirable to provide an improved method for making a leadframe for PCB-based modules.

SUMMARY

Embodiments of the present invention relate to a method for making a leadframe, comprising steps of: removing, from a single metal sheet, a unitary structure comprising a plurality of parallel, substantially strip-shaped electrical conductors and at least one cross member interconnecting the plurality of electrical conductors; embedding an end portion of each electrical conductor of the structure in a mass of molding compound defining a leadframe body, a lead portion of each electrical conductor remaining exterior to the mass of molding compound; and separating the plurality of electrical conductors from each other by cutting the cross member while portions of each electrical conductor remain encapsulated in the molding compound.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

DETAILED DESCRIPTION

Figure 1:
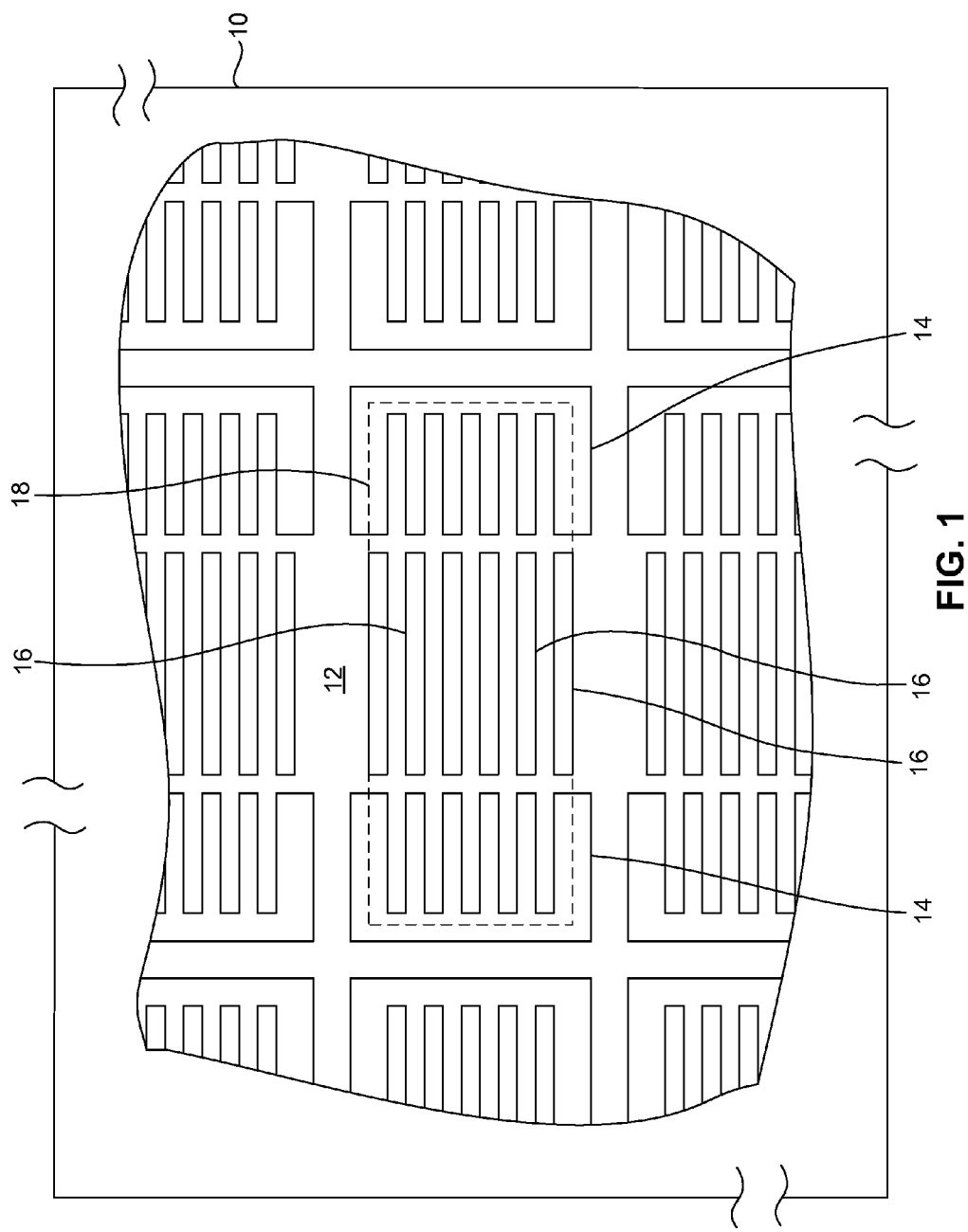
FIG. 1 is a top plan view illustrating a stamped metal sheet, in accordance with exemplary embodiments of the invention.

As illustrated in FIG. 1, in an illustrative or exemplary embodiment of the invention, a method begins with providing a sheet 10 of metal, such as copper. Sheet 10 is then stamped or die-cut to leave a region 12 of metal and remove the metal from the remainder of sheet 10. More specifically, a repeating pattern of comb-shaped regions 14 and bar-shaped regions 16 can be removed from sheet 10 by such stamping or die-cutting, thereby leaving region 12 intact. A metal structure 18 is then cut out of region 12. Although only one exemplary metal structure 18 is indicated (outlined in broken line) in FIG. 1, it can be appreciated from the aforementioned repeating pattern that many such metal structures 18 can be removed from a single sheet 10.

Figure 2:
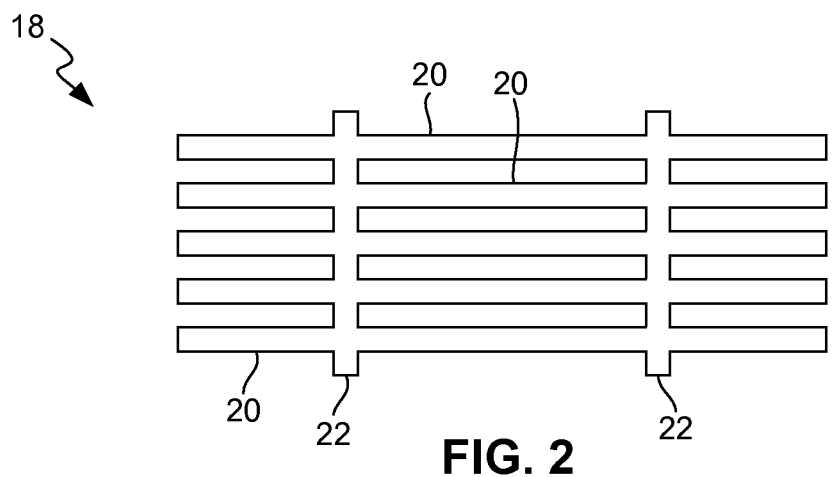
FIG. 2 is a top plan view of one structure stamped out of the metal sheet of FIG. 1.

As illustrated in FIG. 2, metal structure 18 comprises a number of parallel, substantially strip-shaped electrical conductors 20 and cross members 22 that interconnect the conductors 20. Cross members 22 are perpendicular to conductors 20. Although in the exemplary embodiment there is a set of five conductors 20 and a set of two cross members 22 in structure 18, in other embodiments (not shown) there can be any other suitable number of such conductors and cross members in such a structure.

Figure 3:
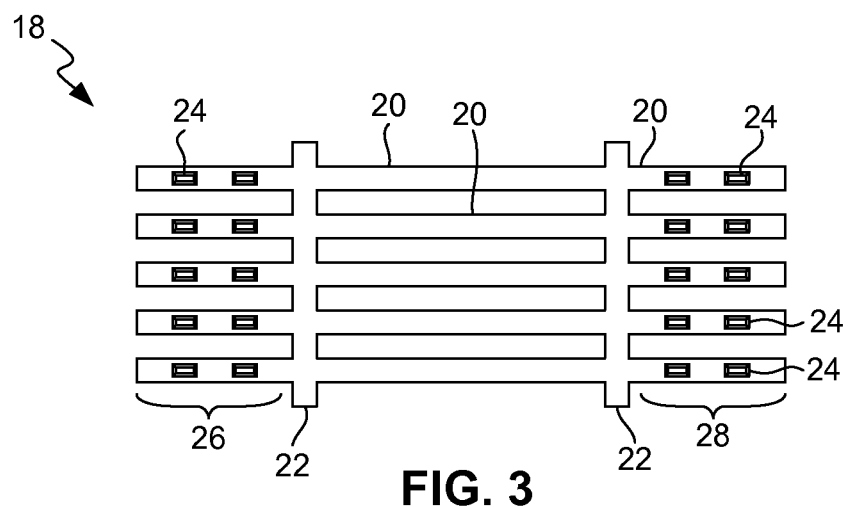
FIG. 3 is similar to FIG. 2, illustrating indentations formed in the structure of FIG. 2.

As illustrated in FIG. 3, dimples or indentations 24 can be formed in the first end portion 26 of the set of conductors 20 and the second end portion 28 of the set of conductors 20.

Figure 4:
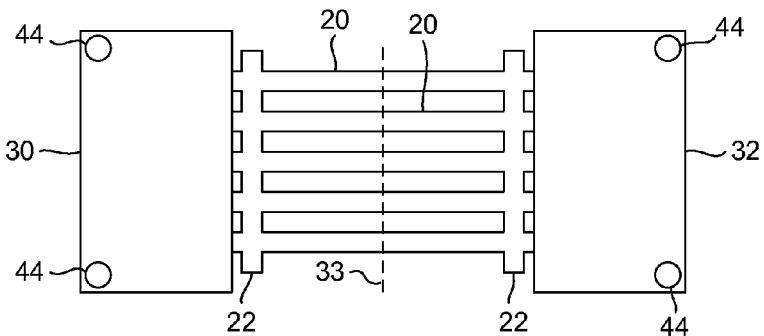
FIG. 4 is a top plan view illustrating two leadframe bodies molded on the structure of FIG. 3.

As illustrated in FIG. 4, first end portion 26 is then embedded in a mass of molding compound by, for example, placing first end portion 26 in a mold (not shown) and introducing molding compound into the mold. The molding compound is then cured in the mold to harden it. The resulting combination of first end portion 26 and the mass of molding compound in which it is embedded defines a first leadframe body 30. Likewise, second end portion 28 is embedded in another mass of molding compound by, for example, placing second end portion 28 in a mold (not shown), introducing molding compound into the mold, and curing the molding compound. The resulting combination of second end portion 28 and the mass of molding compound in which it is embedded defines a second leadframe body 32.

Figure 5:
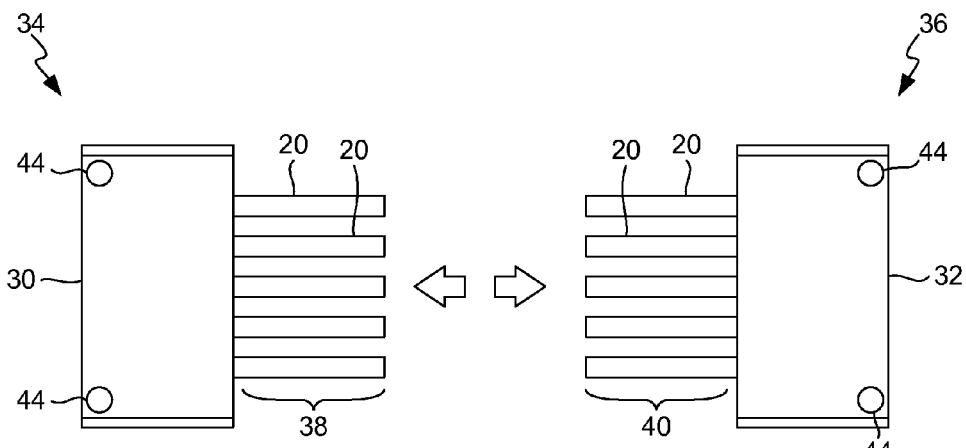
FIG. 5 is a top plan view illustrating cutting the structure of FIG. 4 to separate the two leadframe bodies and associated electrical conductors into two separate leadframes.

Conductors 20 can then be cut along a line 33 between first and second leadframe bodies 30 and 32, resulting in the two separate leadframes 34 and 36 shown in FIG. 5. Cross members 22 are cut away to separate adjacent conductors 20 from each other.

Figure 6A:
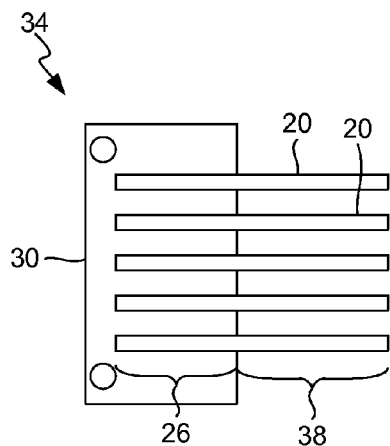
FIG. 6A is a bottom plan view of one of the two leadframes of FIG. 5.
Figure 6B:
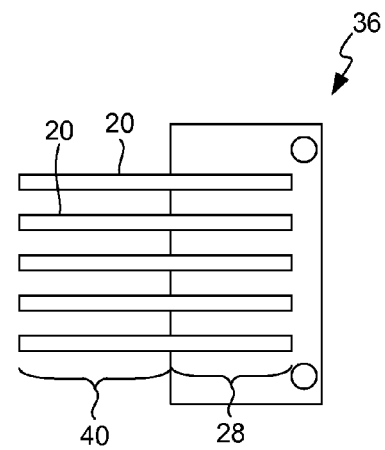
FIG. 6B is a bottom plan view of the other of the two leadframes of FIG. 5.

With additional reference to FIGS. 6A-6B, which show the opposite (lower) side of leadframe bodies 30 and 32 from the (upper) side shown in FIGS. 4-5, note that end portions 26 and 28 of conductors 20 are embedded in the molding compound, while lead portions 38 and 40 of conductors 20 remain exterior to, i.e., not embedded in, the molding compound. Also note in FIG. 7 that the lower surface of each end portion 26 and 28 is substantially coplanar with, i.e., flush with, the lower surface 42 of the respective leadframe body 30 and 32. That is, the lower surface of each end portion 26 and 28 is exposed and not in contact with the molding compound of leadframe bodies 30 and 32.

Figure 7:
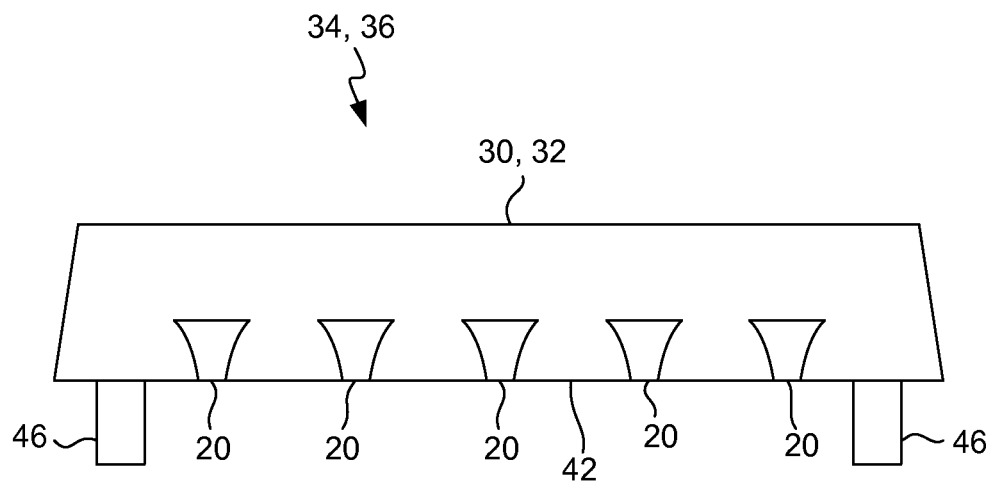
FIG. 7 is an end elevation view of the leadframes of FIGS. 6A-B.

Before cutting cross member 22 and embedding end portions 26 and 28 in the molding compound, an etching process can be performed on the metal structure 18 that etches conductors 20 into a substantially trapezoidal or undercut cross-sectional shape, as shown in FIG. 7. Thus, each conductor 20 has a wider upper surface embedded entirely within (i.e., in contact with) the molding compound and a narrower lower surface substantially coplanar with, i.e., flush with, the lower surface 42 of the respective leadframe body 30 and 32. Embedding such trapezoidally shaped end portions 26 and 28 in this manner aids their retention in the molding compound. Note that the above-described dimples or indentations 24 (FIG. 3) are formed on the wider upper surfaces of end portions 26 and 28 and also aid retention in the molding compound.

Each leadframe body 30 and 32 can include holes 44. Pins 46 (FIG. 7) can be inserted into holes 44. As described below, pins 46 can be used to aid alignment and mounting of leadframes 34 and 36.

Figure 8:
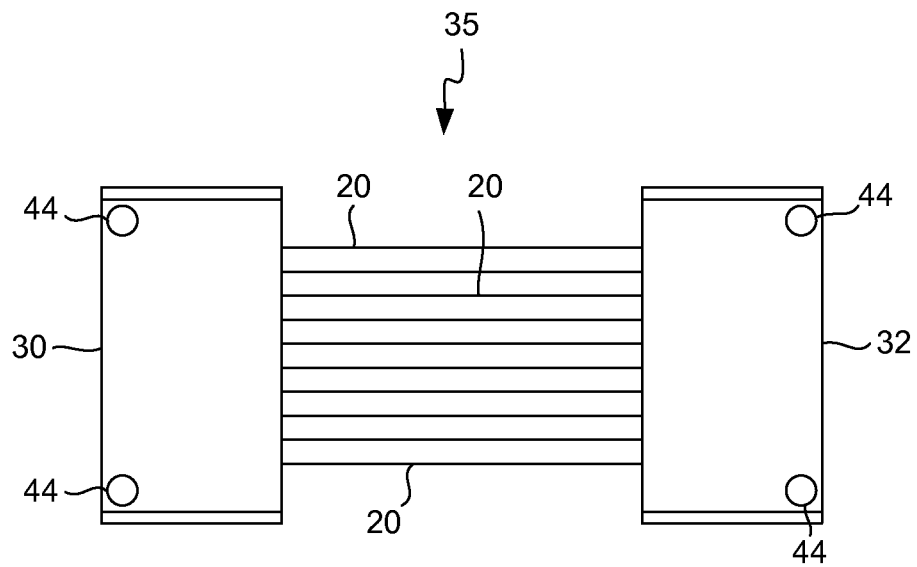
FIG. 8 is a top plan view of an alternative leadframe formed by not cutting the structure of FIG. 4 into two separate leadframes.

As illustrated in FIG. 8, an alternative leadframe 35 can be provided by not cutting conductors 20 in the manner described above. Rather, conductors 20 are left intact. Cross members 22 are cut away to separate adjacent conductors 20 from each other. The resulting leadframe 35 thus includes both leadframe bodies 30 and 32.

Figure 9:
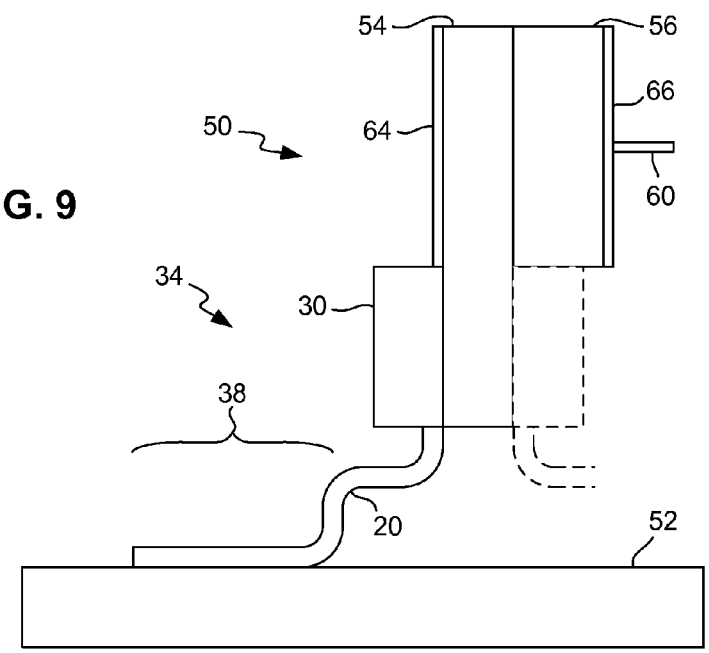
FIG. 9 is a side elevation view of an opto-electronic module connected to a main printed circuit board by a leadframe having only one leadframe body.
Figure 10:
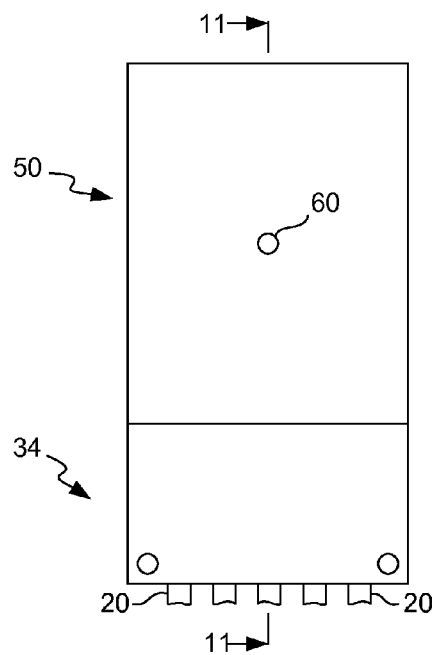
FIG. 10 is a front elevation of the opto-electronic module and a portion of the leadframe of FIG. 9.
Figure 11:
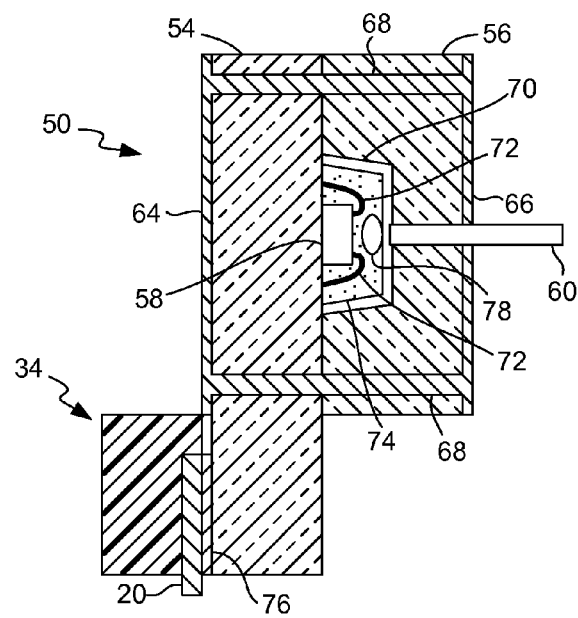
FIG. 11 is a sectional view taken on line 11-11 of FIG. 10.

As illustrated in FIGS. 9-11, an optical data communication module 50 is connected to a main printed circuit board (PCB) 52 by the above-described leadframe 34. Optical data communication module 50 includes a first PCB 54 attached in a back-to-back or abutting manner with a second PCB 56, with an opto-electronic device 58 (FIG. 11), such as a laser chip or photodetector chip, positioned between first and second PCBs 54 and 56 in the manner described below. An optical fiber 60 extends from second PCB 56. A first surface of first PCB 54 has a metal layer 64, and a second surface of second PCB 56 has a metal layer 66. The second surface of first PCB 54 abuts the first surface of second PCB 56. The first surface of second PCB 56 has a recess 70 (FIG. 11) for accommodating opto-electronic device 58 as described below. A number of PCB vias 68 extend through PCBs 54 and 56 and electrically couple metal layers 64 and 66 together. Although not shown for purposes of clarity, PCB vias 68 are distributed substantially evenly around the cavity 70 in second PCB 56 in which opto-electronic device 58 is located. The combination of PCB vias 68 and metal layers 64 and 66, which are all electrically coupled together, can serve as a Faraday cage for shielding opto-electronic device 58 against electromagnetic interference (EMI). Such a shielding arrangement is described in co-pending U.S. patent application Ser. No. 13/802,273, filed Mar. 13, 2013, entitled "OPTICAL DATA COMMUNICATION MODULE HAVING EMI CAGE," which is incorporated herein by this reference.

Opto-electronic device 58 is mounted on the second surface of first PCB 54 and is electrically connected to traces or similar conductors in first PCB 54 by bond wires 72. Opto-electronic device 58 and bond wires 72 are encapsulated within a transparent overmold 74. Although individual PCB layers are not shown for purposes of clarity, first PCB 54 is a multi-layer structure having conductive traces or similar conductors, including an array of solder pads 76 (FIG. 11) on an outer layer. Electrical signals can be communicated between opto-electronic device 58 and the array of solder pads 76. In an instance in which opto-electronic device 58 is a laser chip, opto-electronic device 58 receives such electrical signals and converts them into corresponding optical signals, which opto-electronic device 58 emits generally along an optical axis normal to first and second PCBs 54 and 56. An end of optical fiber 60 is retained in a bore or hole through second PCB 56 and receives these optical signals through a lens 78 that focuses the light emitted by opto-electronic device 58 into the end of optical fiber 60. Alternatively, in an instance in which opto-electronic device 58 is a photodiode chip, lens 78 collimates the light emitted from the end of optical fiber 60 onto opto-electronic device 58. Opto-electronic device 58 converts the light (i.e., optical signals) into electrical signals, which are coupled to solder pads 76. For purposes of clarity, only one end of optical fiber 60 is shown. Nevertheless, it should be understood that optical fiber 60 can be used to communicate optical data signals with another system, such as a processing system or control system (not shown).

Leadframe body 30 of leadframe 34 abuts and is attached to first PCB 54. Although not shown in FIG. 9 for purposes of clarity, pins 46 (FIG. 7) engage holes in first PCB 54 to aid alignment and retention. Conductors 20 of leadframe 34 can have one or more bends (e.g., 90 degrees) to facilitate connecting first PCB 54 and main PCB 52, which are perpendicular to each other. As illustrated in FIG. 9, the distal ends of conductors 20 (i.e., lead portion 38 in FIG. 6A) make contact with (i.e., are soldered to) surface-mount pads (not shown for purposes of clarity) on main PCB 52, thereby electrically coupling first PCB 54 and main PCB 52. As illustrated in FIG. 11, the proximal ends of conductors 20 (i.e., end portion 26 in FIG. 6A) make contact with (i.e., are soldered to) solder pads 76 of first PCB 54.

It should be noted that although in the exemplary embodiment illustrated in FIG. 9 leadframe body 30 abuts a first side of first PCB 54, in other embodiments leadframe body 30 can abut the opposite or second side of first PCB 54, as indicated in broken line. In still other embodiments, two such leadframe bodies 30 can abut both sides of first PCB 54. This feature, by which leadframe body 30 can abut (and be attached to) either side or both sides of first PCB 54 applies to each of the further exemplary embodiments described below. However, for purposes of clarity only one such arrangement is shown and described with regard to each embodiment.

Figure 12:
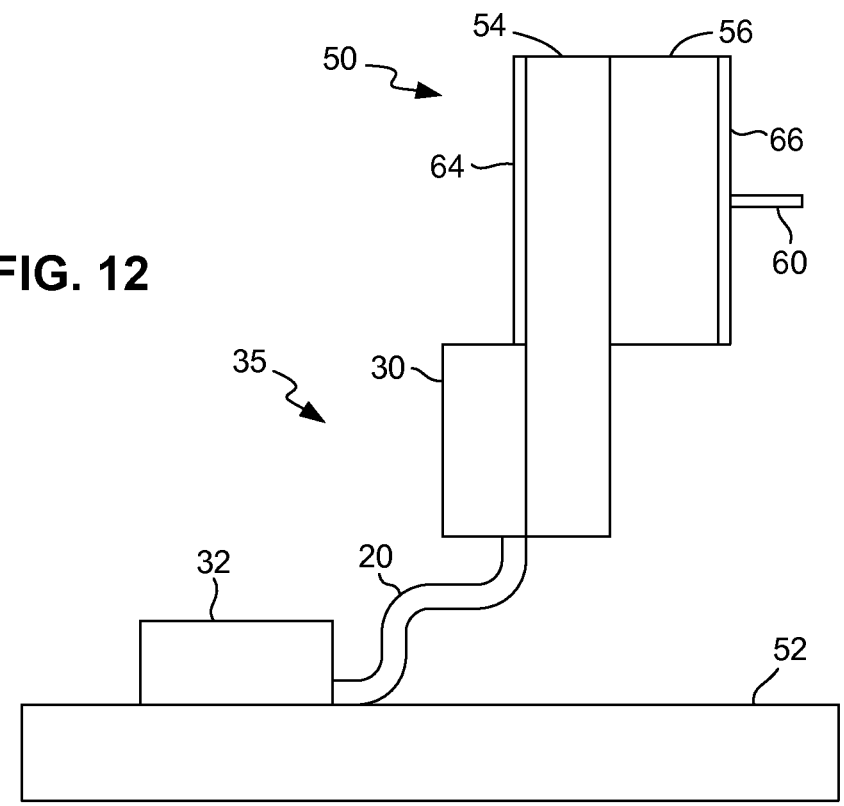
FIG. 12 is a side elevation view of an opto-electronic module connected to a main printed circuit board by a leadframe having two leadframe bodies.

As illustrated in FIG. 12, in another exemplary embodiment, optical data communication module 50 is connected to main printed circuit board (PCB) 52 by the above-described leadframe 35. Leadframe body 30 of leadframe 35 abuts and is attached to first PCB 54 in the manner described above with regard to FIGS. 9-11. Leadframe body 32 of leadframe 35 is surface-mounted on main PCB 52. Although not shown in FIG. 12 for purposes of clarity, pins 46 (FIG. 7) extending from leadframe body 30 engage holes in first PCB 54 to aid alignment and retention. Conductors 20 of leadframe 35 can have one or more bends (e.g., 90 degrees) to facilitate connecting first PCB 54 and main PCB 52, which are perpendicular to each other. In a manner similar to that described above with regard to FIGS. 9-11, portions of conductors 20 in leadframe body 30 make contact with (i.e., are soldered to) solder pads 76 (FIG. 11) of first PCB 54. Similarly, portions of conductors 20 in leadframe body 32 make contact with (i.e., are soldered to) surface-mount pads (not shown for purposes of clarity) on main PCB 52, thereby electrically coupling first PCB 54 and main PCB 52.

Figure 13:
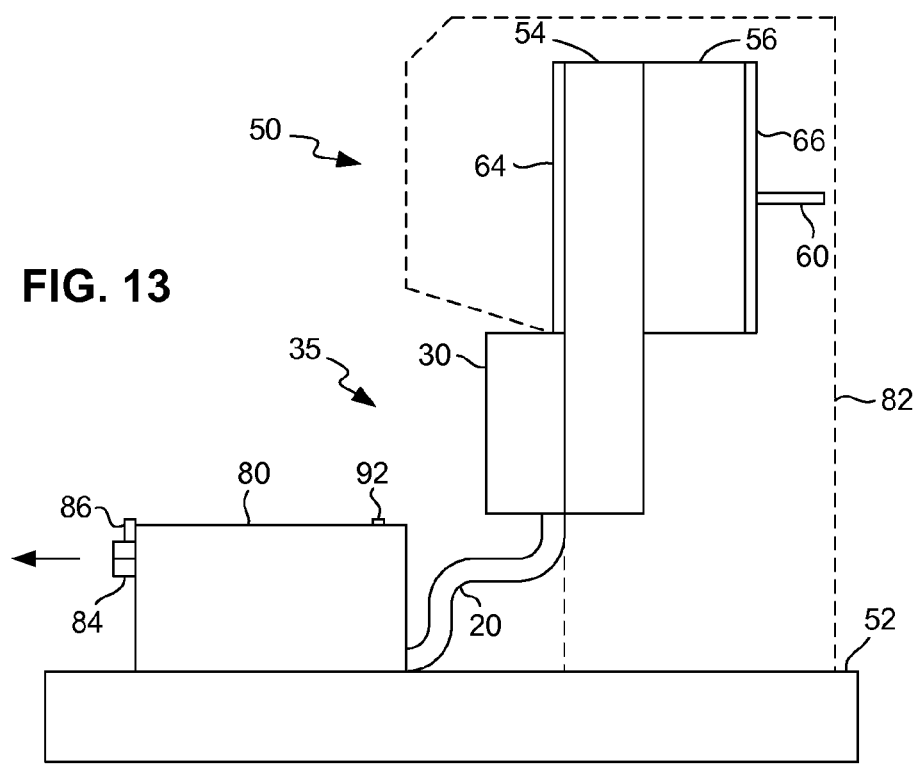
FIG. 13 is a side elevation view of a system in which an opto-electronic module is connected to a main printed circuit board by a leadframe having two leadframe bodies, with one leadframe body secured in a receptacle housing on the main printed circuit board.
Figure 14:
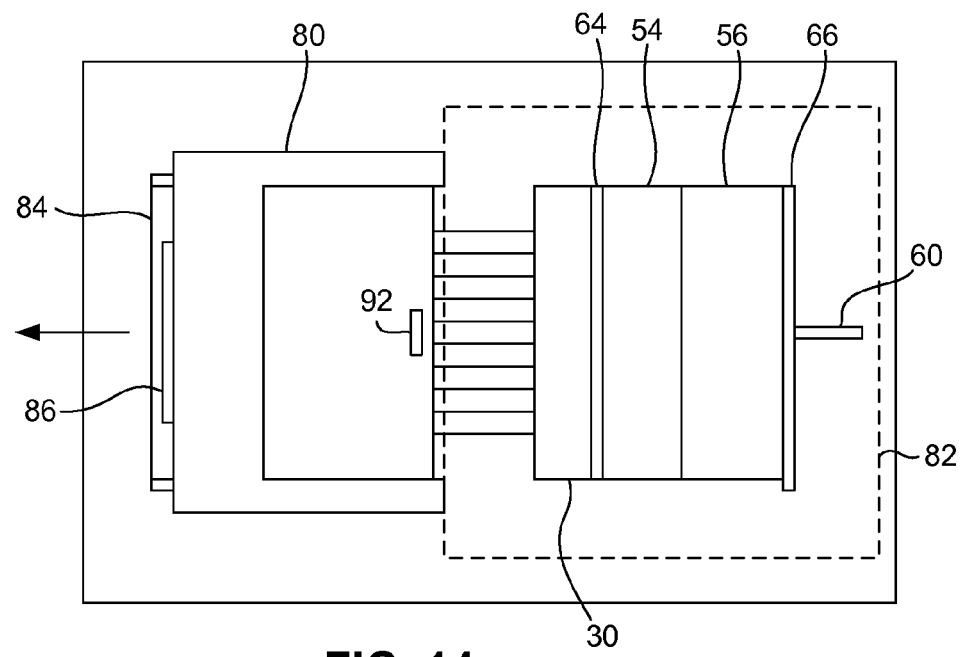
FIG. 14 is a top plan view of the system of FIG. 13, showing the leadframe body secured in a receptacle housing by a latching mechanism.

As illustrated in FIGS. 13-14, in another exemplary embodiment, optical data communication module 50 is connected to main printed circuit board (PCB) 52 by the above-described leadframe 35. Conductors 20 of leadframe 35 can have one or more bends (e.g., 90 degrees) to facilitate connecting first PCB 54 and main PCB 52, which are perpendicular to each other. Leadframe body 30 of leadframe 35 is attached to first PCB 54 in the manner described above with regard to FIGS. 9-11. Unlike the embodiments shown in FIGS. 9-12, in this embodiment leadframe body 32 of leadframe 35 is secured in a receptacle housing 80, which is mounted on PCB 52. As described below, this embodiment facilitates a user (not shown) installing and removing optical data communication module 50. Accordingly, optical data communication module 50 can include a suitable housing 82 that facilitates such installation and removal by a user.

Figure 15:
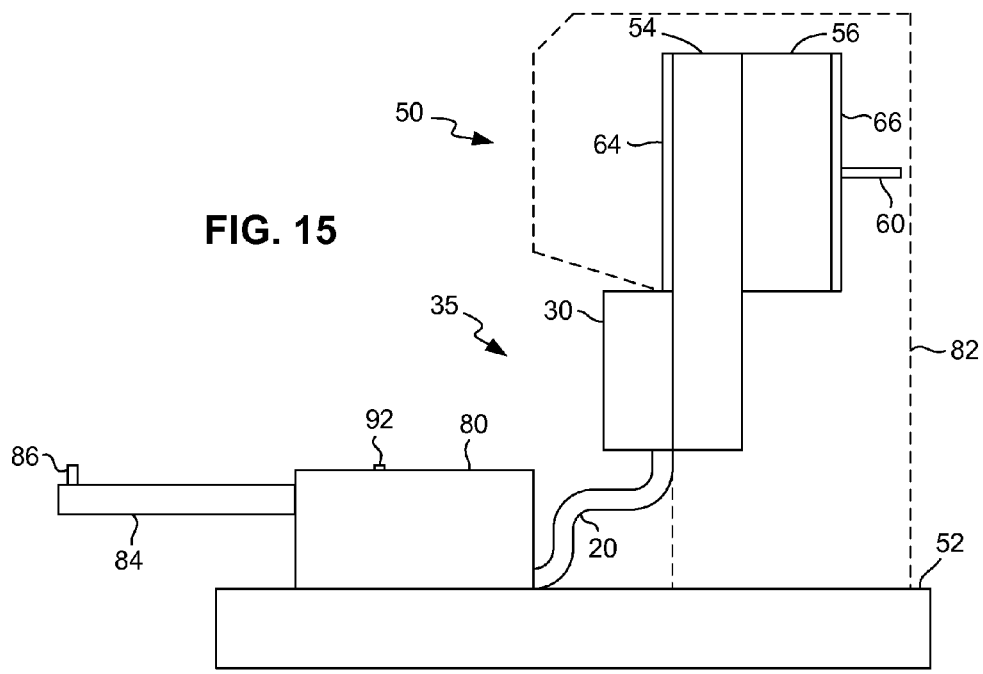
FIG. 15 is similar to FIG. 13, but showing the latching mechanism in a released position.
Figure 16:
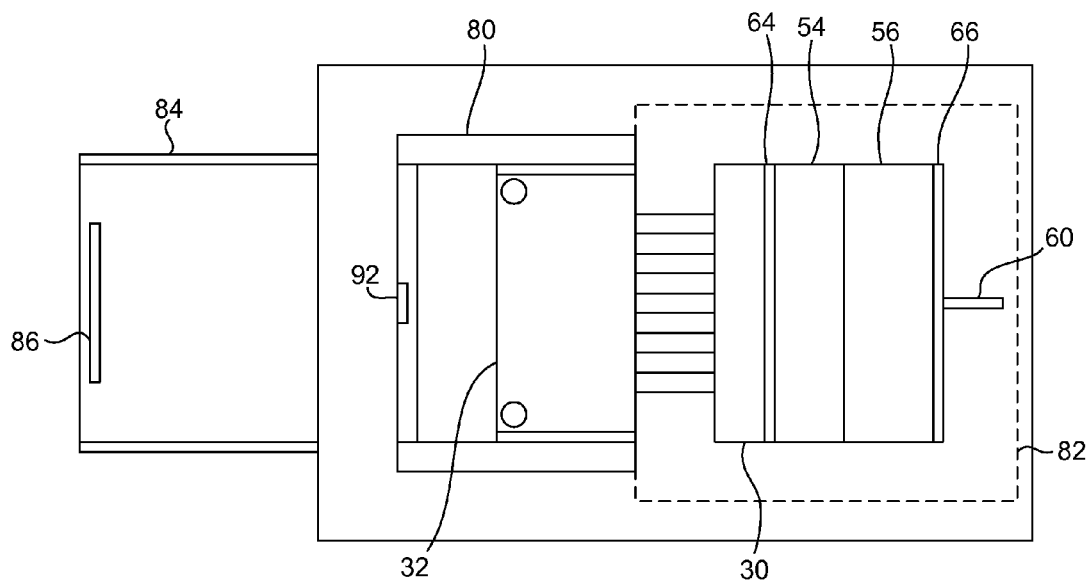
FIG. 16 is similar to FIG. 14, but showing the latching mechanism in a released position.

As illustrated in FIGS. 15-16, a sliding latch 84 secures leadframe body 32 in receptacle housing 80 in the manner described below. In FIGS. 15-16, sliding latch 84 is shown in a released position, while in FIGS. 13-14 sliding latch 84 is shown in a latched or secured position in which leadframe body 32 is secured in receptacle housing 80. A user can move sliding latch 84 from the secured position to the released position by grasping a first stop block 86 of sliding latch 84 and urging it in the direction indicated by the arrows in FIGS. 13-14.

Figure 17:
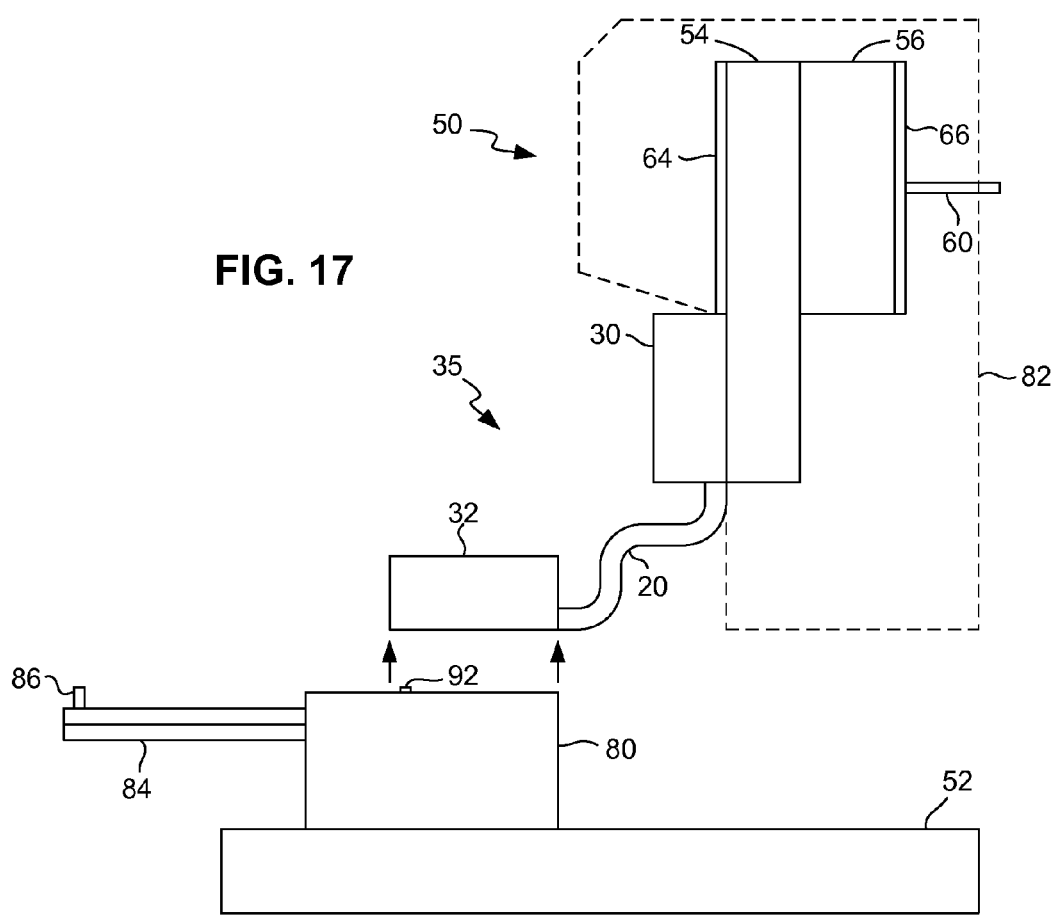
FIG. 17 is similar to FIG. 15, illustrating removal of the leadframe body from the receptacle housing and removal of the opto-electronic module.
Figure 18:
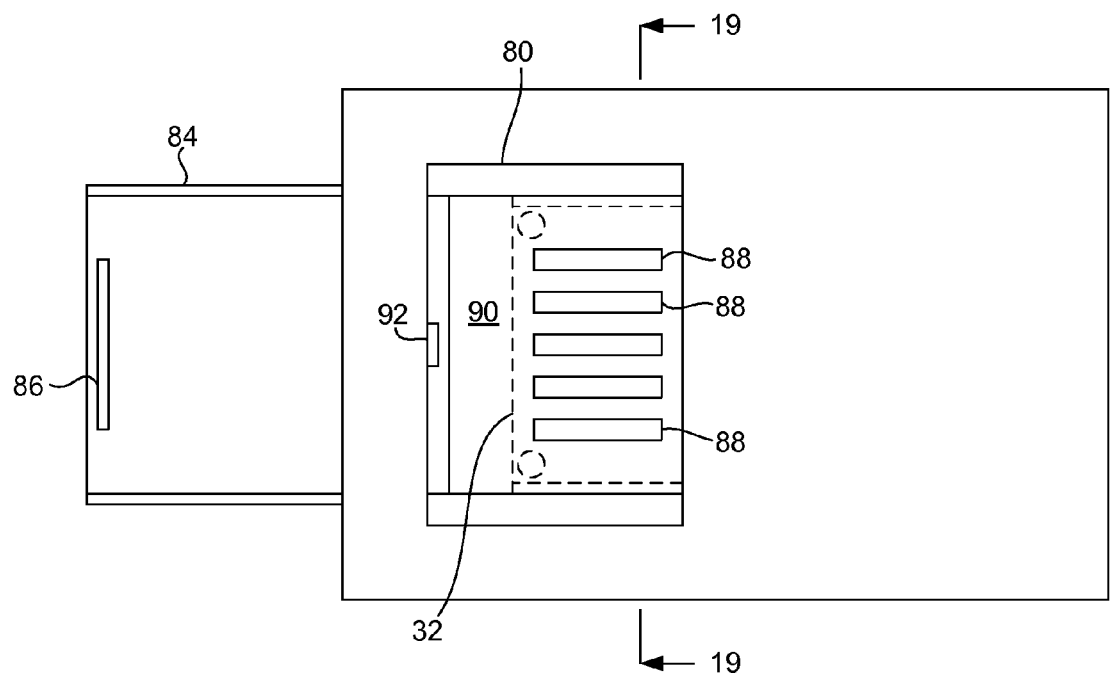
FIG. 18 is a top plan view of the receptacle housing of FIGS. 13-17 after removal of the leadframe body from the receptacle housing and removal of the opto-electronic module.
Figure 19:
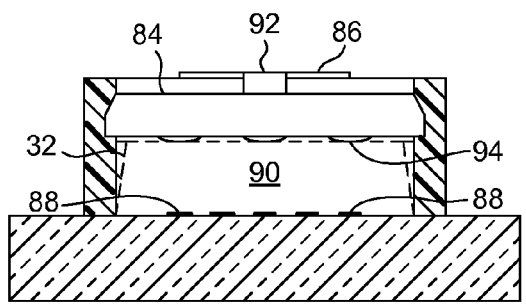
FIG. 19 is a sectional view taken on line 19-19 of FIG. 18.

As illustrated in FIG. 17, when sliding latch 84 is in the released position, a user can remove (e.g., unplug) optical data communication module 50. Leadframe body 32 is lifted out of receptacle housing 80 when optical data communication module 50 is removed. As leadframe body 32 is lifted out of receptacle housing 80, portions of conductors 20 in leadframe body 32 break contact with surface-mount pads 88 on main PCB 52, shown in FIGS. 18-19. Leadframe body 32 is indicated in broken line in FIGS. 18-19 to indicate its position before removal from receptacle housing 80.

A user can install (e.g., plug in) optical data communication module 50 by performing actions in the reverse order from that described above. Accordingly, as optical data communication module 50 is installed, leadframe body 32 is placed into an opening 90 in receptacle housing 80. When leadframe body 32 is placed in receptacle housing 80, portions of conductors 20 in leadframe body 32 make contact with the surface-mount pads 88 on main PCB 52. A user can then slide latch 84 from the released position to the secured position by grasping a second stop block 92. Bumps 94 made of a low-friction, semi-resilient material, such as soft plastic, on the underside of sliding latch 84 exert a resilient force against leadframe body 32 when sliding latch 84 is in the secured position, thereby urging the portions of conductors 20 in leadframe body 32 into contact with the surface-mount pads 88 on main PCB 52. Note that in this embodiment the portions of conductors 20 in leadframe body 32 are not soldered to surface-mount pads 88.

Figure 20:
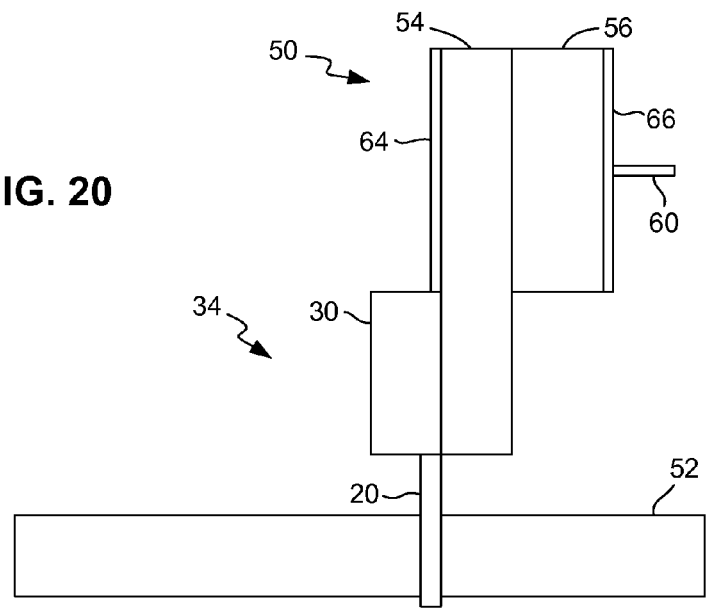
FIG. 20 is a side elevation view of an opto-electronic module connected to a main printed circuit board by a leadframe having leads extending through holes in the main printed circuit board.

As illustrated in FIG. 20, in another exemplary embodiment, optical data communication module 50 is connected to main printed circuit board (PCB) 52 by the above-described leadframe 34. Leadframe body 30 of leadframe 34 is attached to first PCB 54 in the manner described above with regard to other embodiments. However, in this embodiment the distal ends of conductors 20 (i.e., lead portions 38 in FIG. 6A) of leadframe 34 are mounted in holes through main PCB 52 and soldered to pads (not shown for purposes of clarity) on main PCB 52, thereby electrically coupling first PCB 54 and main PCB 52.

Figure 21:
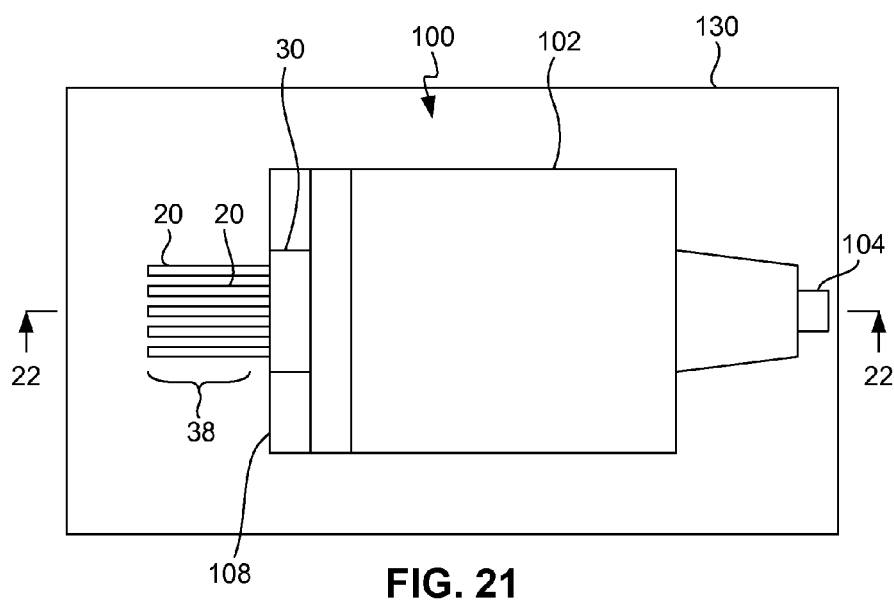
FIG. 21 is a top plan view of an opto-electronic module connected to a main printed circuit board by a leadframe, with the leadframe body oriented parallel to a module printed circuit board of the opto-electronic module.
Figure 22:
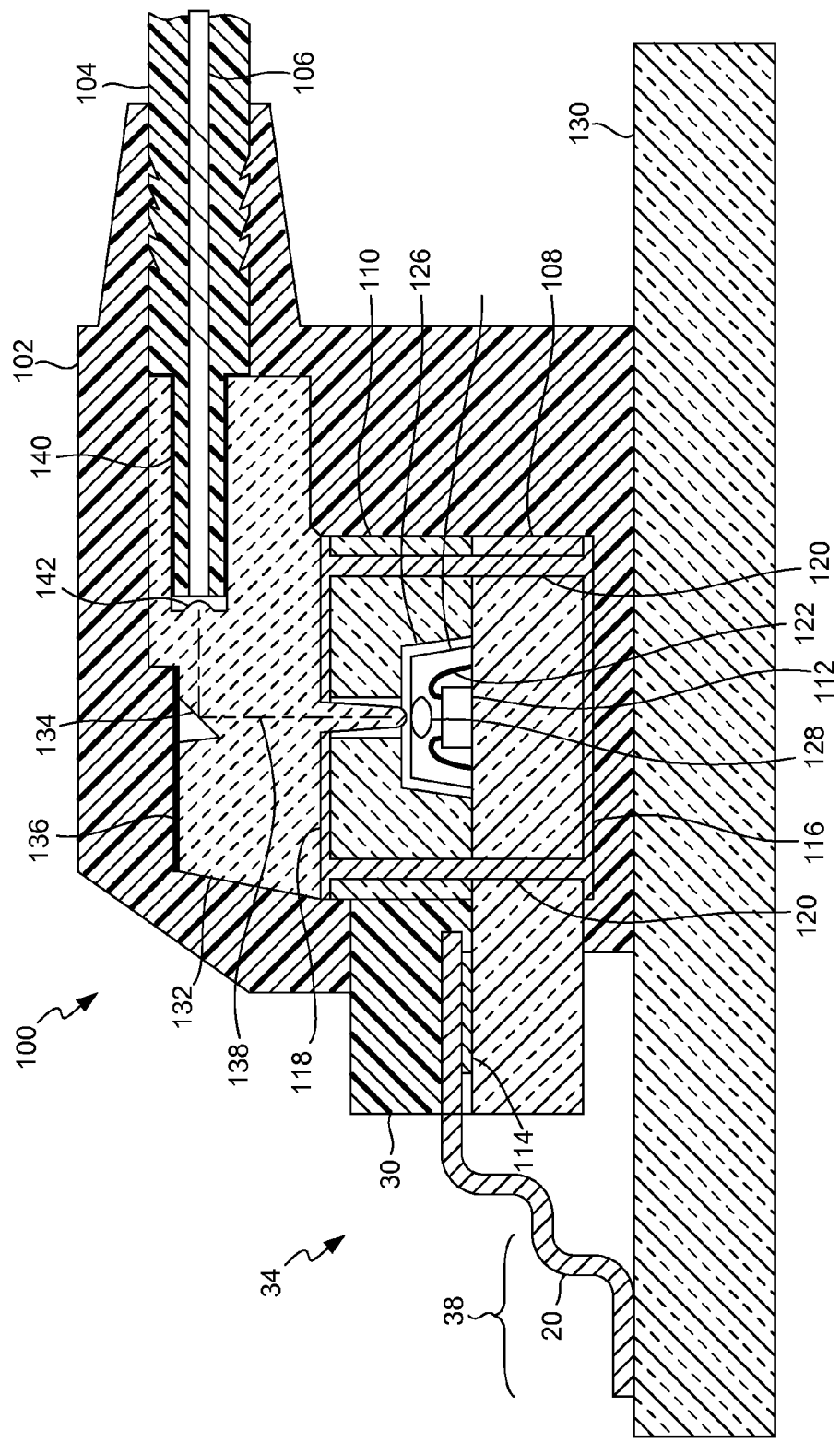
FIG. 22 is a sectional view taken on line 22-22 of FIG. 21.

As illustrated in FIGS. 21-22, in another exemplary embodiment, an optical data communication module 100 has a housing 102. Optical data communication module 100 interfaces with a plug 104 containing an optical fiber 106. Optical data communication module 100 includes a first PCB 108 attached in a back-to-back manner with a second PCB 110, with an opto-electronic device 112, such as a laser chip or a photodetector chip, positioned between first and second PCBs 108 and 110 in the manner described above with regard to FIGS. 9-11. First PCB 108 includes an array of solder pads 114. A first surface of first PCB 108 has a metal layer 116, and a second surface of second PCB 110 has a metal layer 118. A number of PCB vias 120 extend through PCBs 108 and 110 and electrically couple metal layers 116 and 118 together.

Opto-electronic device 112 is electrically connected to traces or similar conductors in first PCB 108 by bond wires 122. Opto-electronic device 112, bond wires 122 and a lens 128 are encapsulated within a transparent overmold 124 inside the cavity 126 in second PCB 110. Although individual PCB layers are not shown for purposes of clarity, first PCB 108 is a multi-layer structure having conductive traces or similar conductors, including the array of solder pads 114. Opto-electronic device 112 can communicate electrical signals with the array of solder pads 114 and otherwise operates in the same manner as opto-electronic device 58 in the above-described embodiment illustrated in FIGS. 9-11.

Leadframe body 30 of leadframe 34 is attached to first PCB 108 in the same manner as described above with regard to the attachment of leadframe body 30 to first PCB 54 (e.g., FIGS. 9-11) in other embodiments. Conductors 20 of leadframe 34 can have one or more bends (e.g., 90 degrees) to facilitate connecting first PCB 108 and a main PCB 130, which are parallel to each other. The proximal ends of conductors 20 (i.e., end portion 26 in FIG. 6A) make contact with (i.e., are soldered to) solder pads 114 of first PCB 108. The distal ends of conductors 20 (i.e., lead portion 38 in FIG. 6A) make contact with (i.e., are soldered to) surface-mount pads (not shown for purposes of clarity) on main PCB 130, thereby electrically coupling first PCB 108 and main PCB 130.

An optics block 132 made of a material transparent to the wavelength of the optical signals associated with opto-electronic device 112 is mounted on second PCB 110. An example of a suitable material from which optics block 132 can be made is a material from the well-known family of amorphous thermoplastic polyetherimide resins produced by SABIC Corporation of Saudi Arabia (formerly General Electric Plastics Division) under the brand name ULTEM. Molded unitarily with the remainder of optics block 132 is a reflective surface 134. In other words, reflective surface 134 is part of the mass of molded resin of which optics block 132 consists. A protective film 136 covers reflective surface 134. In operation, the optical signal propagates along a path 138. Reflective surface 134 is positioned on path 138 to redirect the optical signals between opto-electronic device 112 and a fiber port 140 in optics block 132. A portion of plug 104 extends into fiber port 140. A lens 142 is located in fiber port 140.

It should be noted that the invention has been described with respect to illustrative embodiments for the purpose of describing the principles and concepts of the invention. The invention is not limited to these embodiments. As will be understood by those skilled in the art in view of the description being provided herein, many modifications may be made to the embodiments described herein without deviating from the goals of the invention, and all such modifications are within the scope of the invention.

What is claimed is:

1. A method for making an electrical connector, comprising:
   removing from a single metal sheet a unitary structure comprising a plurality of parallel substantially strip-shaped electrical conductors and at least one cross member interconnecting the plurality of electrical conductors;
   embedding an end portion of each electrical conductor of the structure in a mass of molding compound defining a leadframe body, a lead portion of each electrical conductor remaining exterior to the mass of molding compound; and
   separating the plurality of electrical conductors from each other by cutting the cross member while portions of each electrical conductor remain embedded in the molding compound.

2. The method of claim 1, wherein the end portion of each electrical conductor has a planar surface not in contact with the molding compound and substantially coplanar with a lower surface of the leadframe body.

3. The method of claim 1, wherein removing from a single metal sheet a unitary structure comprising a plurality of parallel substantially strip-shaped electrical conductors and at least one cross member interconnecting the plurality of electrical conductors comprises stamping the single metal sheet.

4. The method of claim 1, wherein the end portion of each electrical conductor has an indentation.

5. The method of claim 4, wherein embedding an end portion of each electrical conductor of the structure comprises:
   placing the end portion of each electrical conductor in a mold cavity; and
   introducing the molding compound into the mold cavity, wherein the molding compound conforms to a shape of the indentation.

6. The method of claim 1, wherein the leadframe body includes a plurality of fastening features selected from the group consisting of pins extending from the leadframe body and holes extending through the leadframe body.

7. The method of claim 1, wherein the end portion of each electrical conductor has a substantially trapezoidal cross-sectional shape.

8. The method of claim 1, further comprising forming a bend in the lead portion of each electrical conductor.

9. The method of claim 8, further comprising:
   attaching the leadframe body to an optical data communication module having a module printed circuit board, the end portion of each electrical conductor contacting an electrical contact pad of the module printed circuit board; and
   surface mounting the lead portion of each electrical conductor to a surface of a main printed circuit board, the lead portion of each electrical conductor contacting an electrical contact pad of the main printed circuit board.

10. The method of claim 9, wherein the module printed circuit board is substantially perpendicular to the main printed circuit board.

11. The method of claim 9, wherein the module printed circuit board is substantially parallel to the main printed circuit board.

12. The method of claim 9, wherein a plurality of pins connect the leadframe body to the module printed circuit board.

13. The method of claim 1, further comprising:
   attaching the leadframe body to an optical data communication module having a module printed circuit board, the end portion of each electrical conductor contacting an electrical contact pad of a surface of the module printed circuit board; and
   mounting the lead portion of each electrical conductor in a hole in a surface of a main printed circuit board.

14. The method of claim 1, wherein:
the structure comprises two cross members; and
embedding an end portion of each electrical conductor in a mass of molding compound comprises embedding a first end portion of each electrical conductor in a first mass of molding compound defining a first leadframe body and embedding a second end portion of each electrical conductor in a second mass of molding compound defining a second leadframe body.

15. The method of claim 14, further comprising cutting each electrical conductor of the plurality of electrical conductors at a location between the first and second leadframe bodies.

16. The method of claim 14, further comprising:
attaching the first leadframe body to an optical data communication module having a module printed circuit board, each first end portion contacting an electrical contact pad of a surface of the module printed circuit board; and
attaching the second leadframe body a main printed circuit board, each second end portion contacting an electrical contact pad of a surface of the main printed circuit board.

17. The method of claim 16, wherein attaching the second leadframe body a main printed circuit board comprises:
mounting a receptacle housing on the main printed circuit board, the receptacle housing having an opening;
mounting the second leadframe body in the opening in the receptacle housing; and
moving a latch member from a released position to a secured position, the second leadframe body retained between the latch member in the secured position and the surface of the main printed circuit board, the latch member exerting a force against the second leadframe body to urge each second end portion into contact with an electrical contact pad of a surface of the main printed circuit board.

18. A method for making an electrical connector, comprising:
stamping from a single metal sheet a unitary structure comprising a plurality of parallel substantially strip-shaped electrical conductors and at least one cross member interconnecting the plurality of electrical conductors;
embedding an end portion of each electrical conductor of the structure in a mass of molding compound defining a leadframe body, a lead portion of each electrical conductor remaining exterior to the mass of molding compound, wherein the end portion of each electrical conductor has a planar surface not in contact with the molding compound and substantially coplanar with a lower surface of the leadframe body;
separating the plurality of electrical conductors from each other by cutting the cross member while portions of each electrical conductor remain embedded in the molding compound;
attaching the leadframe body to an electronic module having a module printed circuit board, the end portion of each electrical conductor contacting an electrical contact pad of the module printed circuit board; and
surface mounting the lead portion of each electrical conductor to a surface of a main printed circuit board, the lead portion of each electrical conductor contacting an electrical contact pad of the main printed circuit board.

19. The method of claim 18, further comprising, before surface mounting the lead portion of each electrical conductor, forming a bend of approximately 90 degrees in the lead portion of each electrical conductor between the leadframe body and the lead portion of each electrical conductor.

20. The method of claim 18, wherein the electronic module is an optical data communication module.

* * * * *